(12) United States Patent
Kim et al.

(10) Patent No.: US 11,114,649 B2
(45) Date of Patent: Sep. 7, 2021

(54) LIGHT-EMITTING DISPLAY DEVICE

(71) Applicant: LG DISPLAY CO., LTD., Seoul (KR)

(72) Inventors: Dongyoung Kim, Paju-si (KR);
Changhwa Jun, Paju-si (KR);
Yongbaek Lee, Paju-si (KR); Jang Jo,
Paju-si (KR); Jiho Ryu, Paju-si (KR);
Hyejin Gong, Paju-si (KR); **Yeonsuk
Kang**, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/197,271

(22) Filed: Nov. 20, 2018

(65) Prior Publication Data

US 2019/0165326 A1  May 30, 2019

(30) Foreign Application Priority Data

Nov. 30, 2017  (KR) .................. 10-2017-0163571

(51) Int. Cl.
*H01L 51/52* (2006.01)
*H01L 27/32* (2006.01)
*H01L 51/50* (2006.01)

(52) U.S. Cl.
CPC ........ *H01L 51/5284* (2013.01); *H01L 27/322* (2013.01); *H01L 27/3246* (2013.01); *H01L 51/5228* (2013.01); *H01L 51/5253* (2013.01); *H01L 51/5262* (2013.01); *H01L 51/5271* (2013.01); *H01L 51/5293* (2013.01); *H01L 51/5044* (2013.01); *H01L 2251/5315* (2013.01)

(58) Field of Classification Search
CPC ............. H01L 51/5284; H01L 27/3246; H01L 27/322; H01L 51/5253; H01L 51/5228; H01L 51/5044; H01L 2251/5315
See application file for complete search history.

(56) References Cited

U.S. PATENT DOCUMENTS

| | | | |
|---|---|---|---|
| 9,666,649 B2* | 5/2017 | Choi | G02F 1/133512 |
| 10,032,831 B2* | 7/2018 | Matsumoto | H01L 51/5284 |
| 10,141,382 B2* | 11/2018 | Choi | H01L 27/322 |
| 10,185,066 B2* | 1/2019 | Chae | G02B 5/207 |

(Continued)

FOREIGN PATENT DOCUMENTS

| | | |
|---|---|---|
| JP | 2005063785 A | 3/2005 |
| JP | 2007-227275 A | 9/2007 |

(Continued)

OTHER PUBLICATIONS

Search Report dated Mar. 28, 2019 issued in the corresponding European Patent Application No. 18209201.5, pp. 1-8.

(Continued)

*Primary Examiner* — Telly D Green
(74) *Attorney, Agent, or Firm* — Polsinelli PC

(57) ABSTRACT

A light-emitting display device is provided. The light-emitting display device includes a first substrate, a first electrode layer on the first substrate, a bank layer that has openings exposing part of the first electrode layer, an emissive layer on the first electrode layer, bank grooves formed by recessing the bank layer, a second electrode layer on the emissive layer, and a low-reflectivity layer that lies on the second electrode layer and is positioned to correspond to the bank grooves.

8 Claims, 14 Drawing Sheets

(56) References Cited

U.S. PATENT DOCUMENTS

| | | | |
|---|---|---|---|
| 2005/0035353 A1* | 2/2005 | Adachi | H01L 51/5281 257/72 |
| 2005/0127820 A1* | 6/2005 | Yamazaki | H01L 51/5281 313/501 |
| 2005/0140291 A1* | 6/2005 | Hirakata | H01L 51/5237 313/512 |
| 2010/0238376 A1* | 9/2010 | Sakai | G02F 1/1323 349/62 |
| 2011/0175070 A1 | 7/2011 | Kim et al. | |
| 2012/0200801 A1* | 8/2012 | Wheatley | G02B 6/0096 349/61 |
| 2013/0099258 A1 | 4/2013 | Lim et al. | |
| 2013/0235614 A1* | 9/2013 | Wolk | G02B 6/0065 362/607 |
| 2013/0256668 A1* | 10/2013 | Oh | H01L 29/66757 257/59 |
| 2015/0008403 A1* | 1/2015 | Kudo | H01L 51/5284 257/40 |
| 2015/0194474 A1* | 7/2015 | Choi | G02B 5/3016 349/69 |
| 2016/0093680 A1 | 3/2016 | Paek et al. | |
| 2016/0181334 A1 | 6/2016 | Yang | |
| 2017/0117337 A1* | 4/2017 | Kimura | H01L 51/5246 |
| 2017/0117344 A1* | 4/2017 | Yang | H01L 27/3272 |
| 2017/0179211 A1* | 6/2017 | Kanaya | H01L 27/3246 |
| 2017/0196101 A1* | 7/2017 | Ki | H04M 1/185 |
| 2017/0221982 A1* | 8/2017 | Park | H01L 27/3293 |
| 2017/0237041 A1* | 8/2017 | Choi | G02B 5/3016 438/30 |
| 2017/0278907 A1 | 9/2017 | Matsumoto et al. | |
| 2018/0045866 A1* | 2/2018 | Chae | G02B 5/207 |
| 2019/0103450 A1* | 4/2019 | Heo | H01L 51/5206 |
| 2019/0165062 A1* | 5/2019 | Heo | H01L 51/5209 |

FOREIGN PATENT DOCUMENTS

| | | | | |
|---|---|---|---|---|
| JP | 2007227275 | * | 9/2007 | H01L 51/50 |
| KR | 10-2012-0122534 A | | 11/2012 | |
| KR | 20140027699 A | * | 3/2014 | |
| KR | 10-2014-0079017 A | | 6/2014 | |
| KR | 20150077292 A | | 7/2015 | |
| KR | 10-2015-0101001 A | | 9/2015 | |
| TW | 201246552 A | | 11/2012 | |
| TW | 201314883 A | | 4/2013 | |
| TW | 201721926 A | | 6/2017 | |

OTHER PUBLICATIONS

Taiwanese Office Action dated Jun. 28, 2019 in co-pending Taiwanese Patent Application No. 107142773.

Taiwanese Office Action dated Oct. 28, 2019 in counterpart Taiwanese Patent Application No. 107142773 (10 pages) and translation (6 pages).

Office Action dated Nov. 26, 2018 issued in the corresponding Korean Patent Application No. 10-2017-0163571, pp. 1-4.

Examination Report dated Aug. 4, 2020 issued in corresponding European Patent Application No. 18 209 201.5 (6 pages).

* cited by examiner

| Split | Reflectivity (Average:380nm~780nm) | Reflectivity (@550 nm) |
|---|---|---|
| MoTi(Semi-transmissive metal)- ITO(Layer that creates a light path difference)- MoTi(reflexion metal) | 8.97 | 3.04 |

LIGHT-EMITTING DISPLAY DEVICE

CROSS REFERENCE TO RELATED APPLICATION

This application claims the benefit of Korean Patent Application No. 10-2017-0163571, filed on Nov. 30, 2017, which is incorporated herein by reference in its entirety for all purposes as if fully set forth herein

BACKGROUND

Field of the Disclosure

The present disclosure relates to a light-emitting display device.

Description of the Background

The market for displays which act as an intermediary between users and information is growing with the development of information technology. Thus, display devices such as light-emitting displays (LED), liquid crystal displays (LCD), and plasma display panels (PDP) are increasingly used.

Of the aforementioned displays, a light-emitting display comprises a display panel comprising a plurality of subpixels, a drive part that drives the display panel, and a power supply part that supplies electric power to the display panel. The drive part comprises a scan driver that supplies scan signals (or gate signals) to the display panel and a data driver that supplies data signals to the display panel.

In the light-emitting display, when scan signals, data signals, etc. are supplied to subpixels arranged in a matrix form, the light-emitting diodes of selected subpixels emit light, thereby displaying an image. The light-emitting display may be classified as a bottom-emission type that emits light toward a lower substrate or a top-emission type that emits light toward an upper substrate.

Light-emitting displays are attracting attention as next-generation display devices and have other many benefits, since they display an image based on the light produced from the light-emitting diodes included in the subpixels. However, there are still some problems yet to overcome to make ultra-high resolution light-emitting displays.

SUMMARY

Accordingly, the present disclosure is directed to a light-emitting display device that substantially obviates one or more of problems due to limitations and disadvantages of the prior art.

Additional features and advantages of the disclosure will be set forth in the description which follows and in part will be apparent from the description, or may be learned by practice of the invention. Other advantages of the present disclosure will be realized and attained by the structure particularly pointed out in the written description and claims hereof as well as the appended drawings.

An exemplary aspect of the present disclosure provides a light-emitting display device comprising: a first substrate; a first electrode layer on the first substrate; a bank layer that has openings exposing part of the first electrode layer; an emissive layer on the first electrode layer; bank grooves formed by recessing the bank layer; a second electrode layer on the emissive layer; and a low-reflectivity layer that lies on the second electrode layer and is positioned to correspond to the bank grooves.

Another exemplary aspect of the present disclosure provides a light-emitting display device comprising: a first substrate; a first electrode layer on the first substrate; a bank layer that has openings exposing part of the first electrode layer; an emissive layer on the first electrode layer; bank grooves formed by recessing the bank layer; a second electrode layer on the emissive layer; and a polarization layer that lies on the second electrode layer and is positioned to correspond to at least part of the bank layer.

A further exemplary aspect of the present disclosure provides A light-emitting display device having a substrate, including a first electrode layer disposed on the substrate; a bank layer defining an emission area and having a recessed portion; first and second emissive layers respectively disposed on the first electrode layer and in the recessed portion the bank layer, wherein the first and second emissive layers are separated from each other; a second electrode layer disposed on the first and second emissive layer; and a light path control layer disposed on the second electrode layer and is positioned to correspond to the recessed portion of the bank layer.

It is to be understood that both the foregoing general description and the following detailed description are exemplary and explanatory and are intended to provide further explanation of the disclosure as claimed.

BRIEF DESCRIPTION OF THE DRAWINGS

The accompany drawings, which are included to provide a further understanding of the disclosure and are incorporated on and constitute a part of this application, illustrate aspects of the disclosure and together with the description serve to explain the principles of the disclosure.

In the drawings.

DETAILED DESCRIPTION

Reference will now be made in detail aspects of the disclosure examples of which are illustrated in the accompanying drawings.

Hereinafter, concrete aspects of the present disclosure will be described with reference to the accompanying drawings.

A light-emitting display device to be described below may be implemented as a television, a video player, a personal computer (PC), a home theater, a smartphone, a virtual reality (VR) device, an augmented reality (AR) device, etc. Although the light-emitting display device will be described below with respect to an organic light-emitting display device that is based on organic light-emitting diodes (light-emitting display elements), it should be noted that the light-emitting display device to be described below may be implemented based on inorganic light-emitting diodes.

Figure 1:
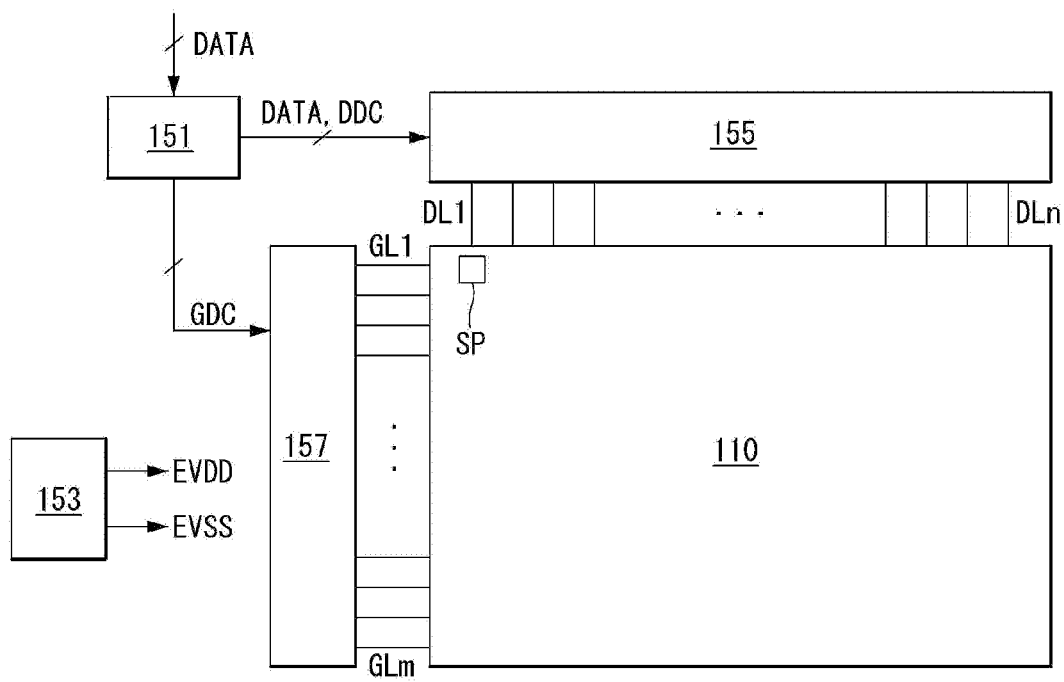
FIG. 1 is a schematic block diagram of an organic light-emitting display device.
Figure 2:
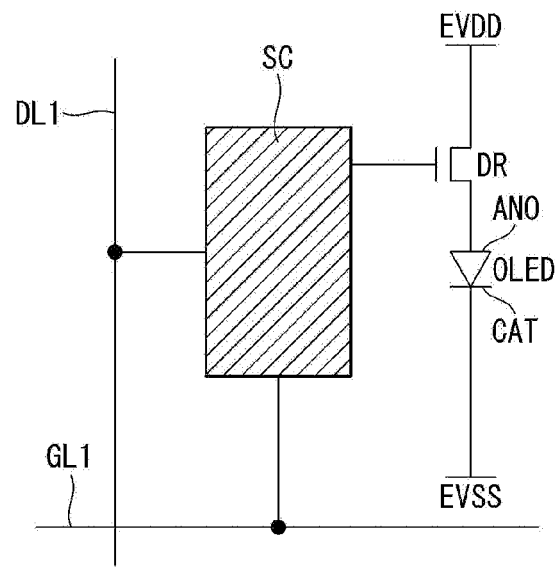
FIG. 2 is a schematic circuit diagram of a subpixel.
Figure 5:
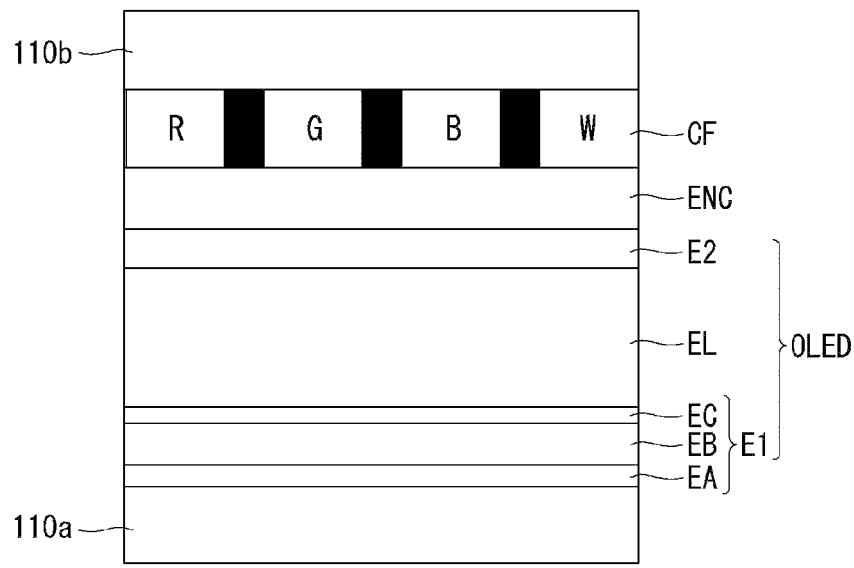
FIG. 5 is a cross-sectional view schematically illustrating subpixels.
Figure 6:
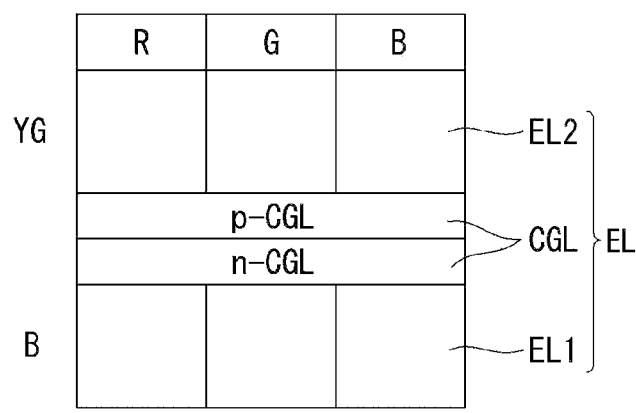
FIG. 6 is an explanatory diagram of the light-emission characteristics of subpixels.

FIG. 1 is a schematic block diagram of an organic light-emitting display device. FIG. 2 is a schematic circuit diagram of a subpixel. FIG. 3 is a detailed circuit diagram illustrating a portion of FIG. 2. FIG. 4 is a cross-sectional view of a display panel. FIG. 5 is a cross-sectional view schematically illustrating subpixels. FIG. 6 is an explanatory diagram of the light-emission characteristics of subpixels.

As shown in FIG. 1, the organic light-emitting display comprises a timing controller 151, a data driver 155, a scan driver 157, a display panel 110, and a power supply part 153.

The timing controller 151 receives drive signals, including a data enable signal, a vertical synchronization signal, a horizontal synchronization signal, and a clock signal, along with data signals DATA, from an image processor (not shown). Based on the drive signals, the timing controller 151 outputs a gate timing control signal GDC for controlling the operation timing of the scan driver 157 and a data timing control signal DDC for controlling the operation timing of the data driver 155. The timing controller 151 may be provided in the form of an IC (integrated circuit)

The data driver 155 samples and latches a data signal DATA supplied from the timing controller 151 in response to a data timing control signal DDC supplied from the timing controller 151, and converts a digital data signal to an analog data signal (or data voltage) as a gamma reference voltage and outputs it. The data driver 155 outputs data signals DATA through data lines DL1 to DLn. The data driver 155 may be provided in the form of an IC (integrated circuit).

The scan driver 157 outputs scan signals in response to a gate timing control signal GDC supplied from the timing controller 151. The scan driver 157 outputs scan signals through scan lines GL1 to GLm. The scan driver 157 may be provided in the form of an IC or formed on the display panel 110 using the gate-in-panel technology (in which transistors are formed using a thin-film process).

The power supply part 153 outputs a high-level voltage and a low-level voltage. The high-level voltage and low-level voltage outputted from the power supply part 153 are supplied to the display panel 110. The high-level voltage is supplied to the display panel 110 via a first power line EVDD, and the low-level voltage is supplied to the display panel 110 via a second power line EVSS. The power supply part 153 may be provided in the form of an IC.

The display panel 110 displays an image in response to data signals DATA supplied from the data driver 155, scan signals supplied from the scan driver 157, and electric power supplied from the power supply part 153. The display panel 110 comprises subpixels SP that work to display an image and emit light.

The subpixels SP may comprise red subpixels, green subpixels, and blue subpixels, or may comprise white subpixels, red subpixels, green subpixels, and blue subpixels. The subpixels SP may have one or more different light-emitting areas depending on the light-emission characteristics.

As shown in FIG. 2, a single subpixel is positioned at the intersection of a data line DL1 and a scan line GL1, and comprises a programming part SC for setting the gate-source voltage of a driving transistor DR and an organic light-emitting diode OLED. The organic light-emitting diode OLED comprises an anode ANO, a cathode CAT, and an organic emissive layer sandwiched between the anode ANO and cathode CAT. The anode ANO is connected to the driving transistor DR.

The programming part SC may comprise a transistor part (transistor array) comprising at least one switching transistor and at least one capacitor. The transistor part is implemented based on CMOS semiconductor, PMOS semiconductor, or NMOS semiconductor. The transistors included in the transistor part may be implemented as p-type or n-type. Moreover, semiconductor layers of the transistors included in the transistor part of the subpixel may contain amorphous silicon, polysilicon, or oxide.

The switching transistor turns on in response to a scan signal from the scan line GL1 to apply a data voltage from the data line DL1 to one electrode of the capacitor. The driving transistor DR adjusts the amount of light emitted from the organic light-emitting diode OLED by controlling the amount of current depending on the amount of voltage stored in the capacitor. The amount of light emitted from the organic light-emitting diode OLED is proportional to the amount of current supplied from the driving transistor DR. Also, the subpixel is connected to a first power supply line EVDD and a second power supply line EVSS to receive high-level voltage and low-level voltage.

Figure 3A:
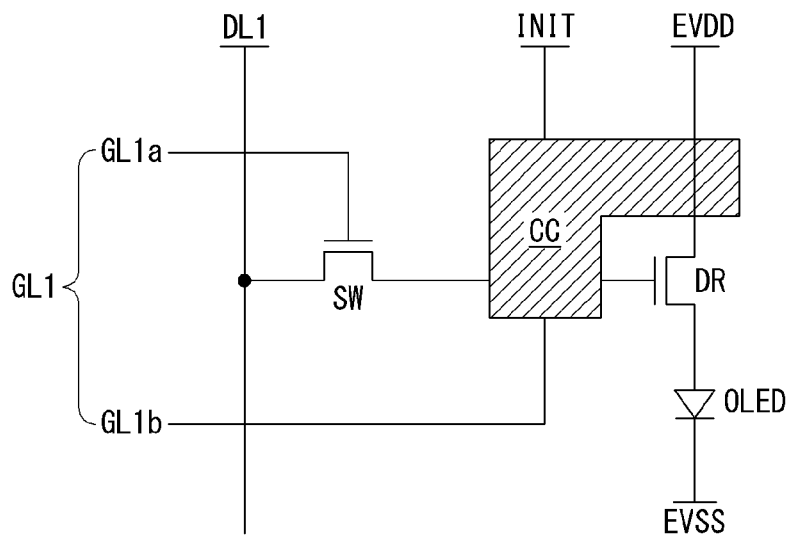
FIGS. 3A and 3B are detailed circuit diagrams illustrating a portion of FIG. 2.

As shown in FIG. 3A, the subpixel may comprise an internal compensation circuit CC, as well as the aforementioned switching transistor SW, driving transistor DR, capacitor Cst, and organic light-emitting diode OLED. The internal compensation circuit CC may comprise one or more transistors connected to a compensation signal line INIT. The internal compensation circuit CC sets the gate-source voltage of the driving transistor DR to a voltage that reflects variation in threshold voltage, so as to cancel out any brightness variation caused by the threshold voltage of the driving transistor DR when the organic light-emitting diode OLED emits light. In this case, the scan line GL1 comprises at least two scan lines GL1a and GL1b for controlling the switching transistor SW and the transistors in the internal compensation circuit CC.

Figure 3B:
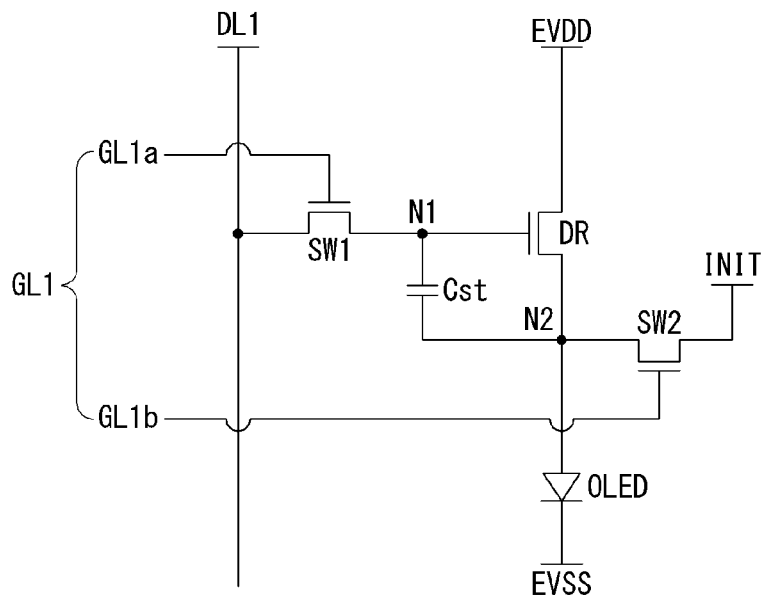

As shown in FIG. 3B, the subpixel may comprise a switching transistor SW1, a driving transistor DR, a sensing transistor SW2, a capacitor Cst, and an organic light-emitting diode OLED. The sensing transistor SW2 is a transistor that may be included in the internal compensation circuit CC, and performs a sensing operation for compensating for the subpixel.

The switching transistor SW1 serves to supply a data voltage supplied through the data line DL1 to a first node N1, in response to a scan signal supplied through the first scan line GL1a. The sensing transistor SW2 serves to reset or sense a second node N2 situated between the driving transistor DR and the organic light-emitting diode OLED, in response to a sensing signal supplied through the second scan line GL1b.

Meanwhile, the above circuit configuration of the subpixel depicted in FIG. 3 is only for ease of comprehension. That is, the circuit configuration of the subpixel according to the present disclosure is not limited to the above, but may vary, including 2T(transistor)1C(capacitor), 3T2C, 4T2C, 5T1C, 6T2C, and 7T2C.

Figure 4A:
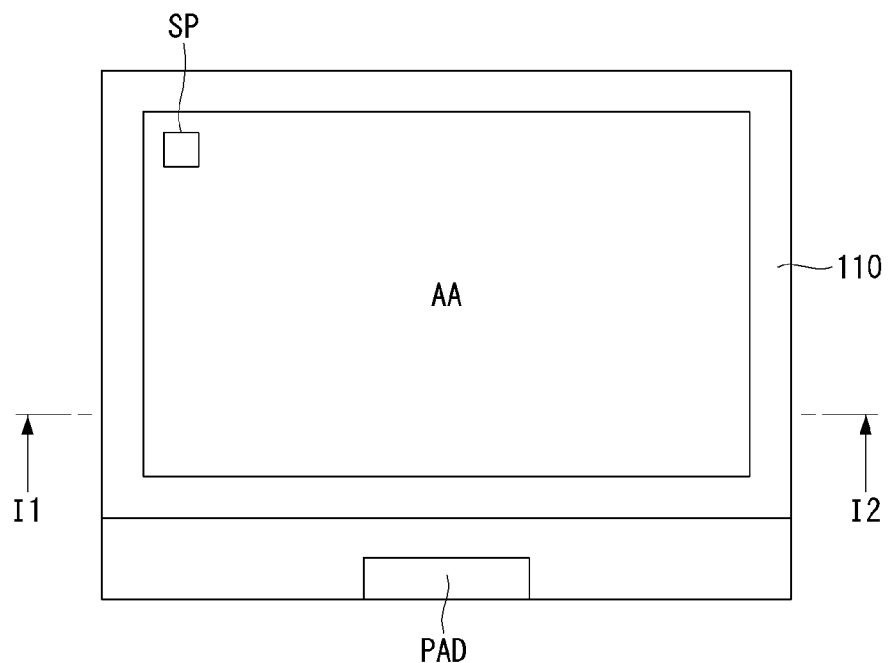
FIGS. 4A and 4B are cross-sectional views of a display panel.
Figure 4B:
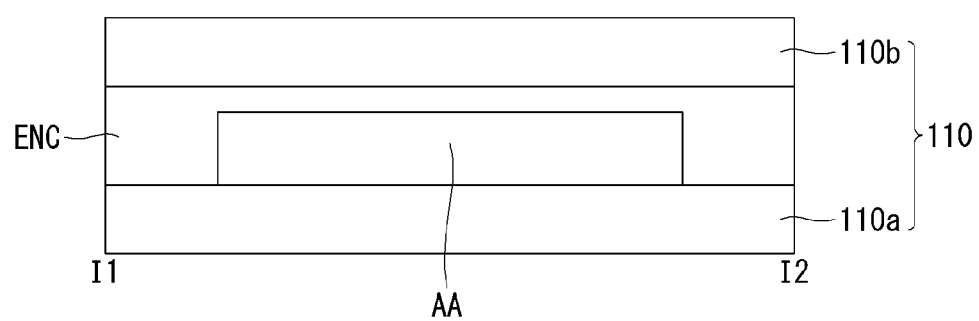

As shown in FIGS. 4A and 4B, the display panel 110 comprises a first substrate 110a, a second substrate 110b, a display area AA, a pad part PAD, and a protective film layer ENC. At least one of the first substrate 110a and the second substrate 110b may be made of a transparent material that lets light through. The first substrate 110a and the second substrate 110b may include one of resin, glass, silicon and the like. The display area AA is made up of subpixels SP that emit light. The pad part PAD is made up of pads for facilitating an electrical connection with an external substrate.

The display area AA is placed to take up most of the surface of the first substrate 110a, and the pad part PAD is placed on one outer edge of the first substrate 110a. The display area AA is sealed with the protective film layer ENC existing between the first substrate 110a and the second substrate 110b and protected from moisture or oxygen. On the other hand, the pad part PAD is exposed externally. However, the display panel 110 is not limited to this structure since it may come in various structures.

As shown in FIG. 5, the subpixels each may comprise a light-emitting diode OLED and a color filter layer CF. The light-emitting diode OLED is formed on one side of the first substrate 110a, and is composed of an anode E1 (or cathode), an emissive layer EL that emits white light or the like, and a cathode E2 (or anode). The light emitted from the light-emitting diode OLED may be turned into a different color by the color filter layer CF. Therefore, the light emitted from the light-emitting diode OLED does not necessarily have to be white light, but the following description will be given with an example in which white light is emitted.

The color filter layer CF turns the white light emitted from the emissive layer EL into red (R), green (G), or blue (B). An area in which red light is emitted by the color filter layer CF is defined as a red subpixel, an area in which blue light is emitted by the color filter layer CF is defined as a blue subpixel, and an area in which white light is emitted by the color filter layer CF is defined as a white subpixel.

The color filter layer CF may be formed on the other side of the second substrate 110a, which faces the light-emitting diodes OLED, or on top of the light-emitting diodes OLED. The protective film layer ENC may be situated between the cathode E2 and the color filter layer CF. However, the protective film layer ENC may be omitted depending on the sealing structure.

The anode E1 may be composed of multiple layers, such as a first electrode layer EA, a second electrode layer EB, and a third electrode layer EC, to improve the light emission toward the second substrate 110a. The first electrode layer EA may be made of a transparent oxide material (e.g., ITO), the second electrode layer EB may be made of a reflective metal material (e.g., Ag), and the third electrode layer EC may be made of a transparent oxide material (e.g., ITO). However, the structure of the anode E1 is not limited to this.

As shown in FIG. 6, the emissive layer EL may comprise a first emissive layer EL1, a charge generation layer CGL, and a second emissive layer EL2. The emissive layer EL comprising the charge generation layer CGL may further comprise two, three, or more emissive layers, in addition to the two emissive layers EL1 and EL2. Therefore, the emissive layer EL comprising the charge generation layer CGL should be construed as comprising at least two emissive layers.

The emissive layers EL may emit white light based on the light emitted from the first emissive layer EL1 and second emissive layer EL2. For example, the first emissive layer EL1 may be made of a material that emits blue light (B), and the second emissive layer EL2 may be made of a material that emits yellowish green (or yellow) light (YG).

The charge generation layer CGL may be formed of a P-N junction of an N-type charge generation layer n-CGL and a P-type charge generation layer p-CGL or an N-P junction, the opposite of the P-N junction. The charge generation layer CGL serves to generate charges or separate holes and electrons to inject the charges into the first emissive layer (first stack) EL1 and the second emissive layer (second stack) EL2. The N-type charge generation layer n-CGL supplies the electrons to the first emissive layer EL1, and the P-type charge generation layer p-CGL supplies the holes to the second emissive layer EL2. Therefore, the luminous efficiency of the elements having a plurality of emissive layers can be further increased, and the driving voltage can be lowered.

The N-type charge generation layer n-CGL may be made of a metal or an N-doped organic material. The metal may be one selected from the group consisting of Li, Na, K, Rb, Cs, Mg, Ca, Sr, Ba, La, Ce, Sm, Eu, Tb, Dy, and Yb. Also, an N-type dopant and host used for the N-doped organic material may be conventionally-used materials. For example, the n-type dopant may be an alkali metal, alkali metal compound, alkali earth metal, or alkali earth metal compound. The N-type dopant may be one selected from the group consisting of Cs, K, Rb, Mg, Na, Ca, Sr, Eu, and Yb. The host may be one selected from the group consisting of tris(8-hydroxyquinoline)aluminum, triazine, a hydroxyquinoline derivative, a benzazole derivative, and a silole derivative.

The P-type charge generation layer p-CGL may be made of a metal or a P-doped organic material. The metal may be one selected from the group consisting of Al, Cu, Fe, Pb, Zn, Au, Pt, W, In, Mo, Ni, and Ti. Also, a P-type dopant and host used for the P-doped organic material may be conventionally-used materials. For example, the P-type dopant may be one selected from the group consisting of 2,3,5,6-tetrafluore-7,7,8,8-tetracyanoquinodimethane (F4-TCNQ), a tetracyanoquinodimethane derivative, iodine, FeCl3, FeF3, and SbC15. The host may be one selected from the group consisting of N,N'-di(naphthalen-1-yl)-N,N-diphenyl-benzidine (NPB), NN'-diphenyl-NN'-bis(3-methylphenyl)-1,1-biphenyl-4,4'-diamine (TPD), and N,N',N'-tetranaphthyl-benzidine (TNB).

<First Exemplary Aspect>

Figure 7:
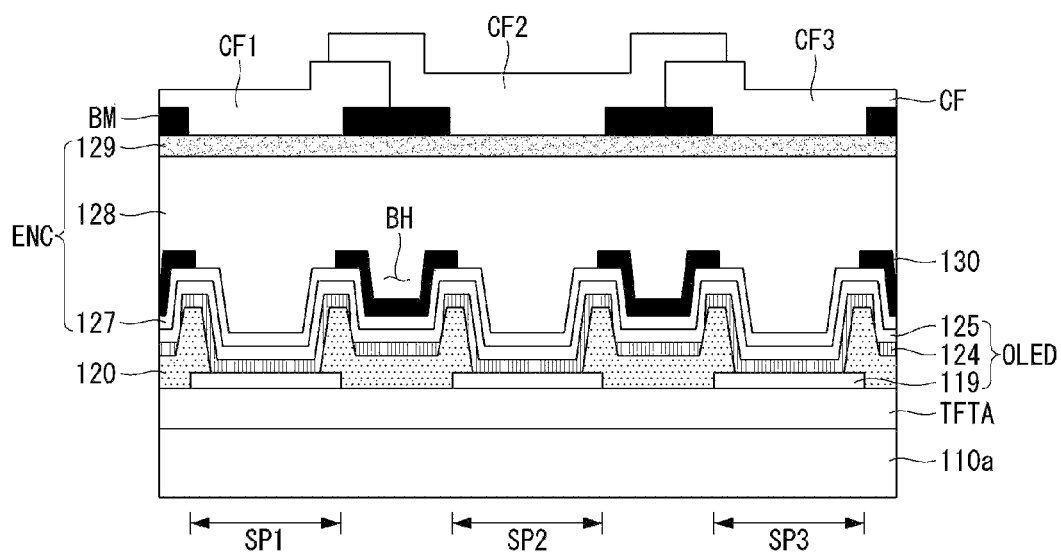
FIG. 7 is a cross-sectional view of a display panel according to a first exemplary aspect of the present disclosure.
Figure 8A:
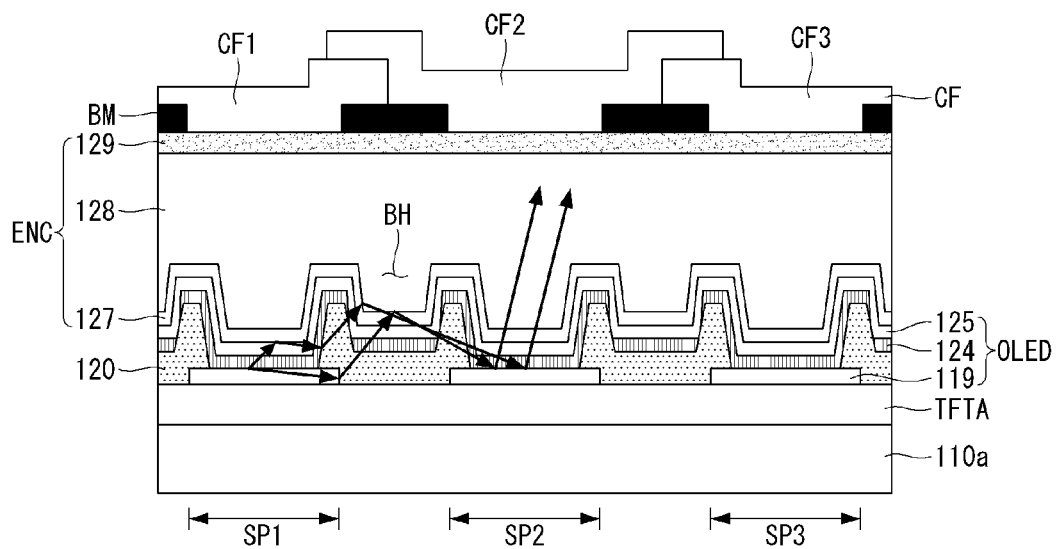
FIGS. 8A and 8B are cross-sectional views for explaining benefits of the first exemplary aspect of the present disclosure.
Figure 8B:
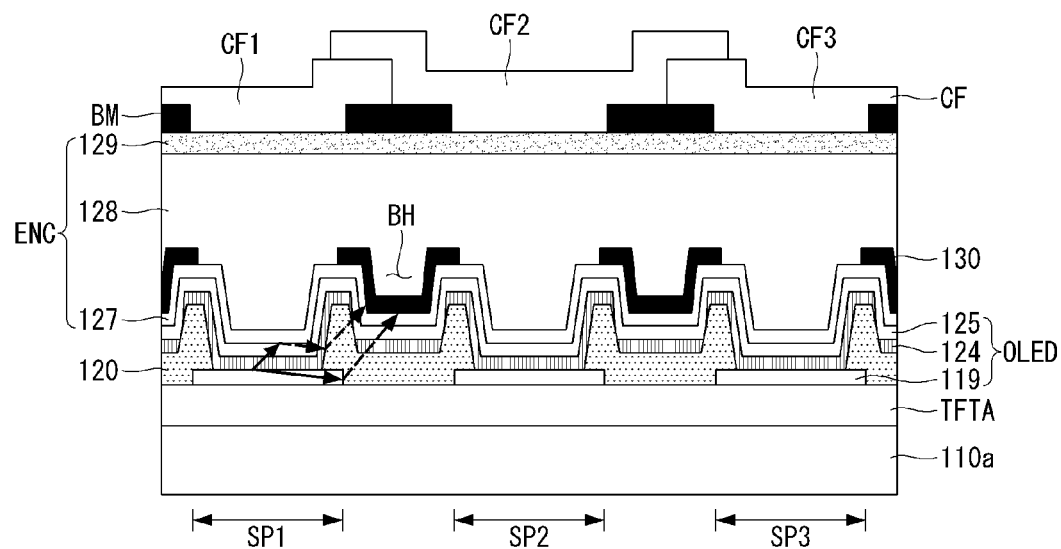

FIG. 7 is a cross-sectional view of a display panel according to a first exemplary aspect of the present disclosure. FIGS. 8A and 8B are cross-sectional views for explaining benefits of the first exemplary aspect of the present disclosure.

As shown in FIG. 7, the display panel according to the first exemplary aspect of the present disclosure comprises a first substrate 110a, a transistor part TFTA, an organic light-emitting diode OLED, a low-reflectivity layer 130, a protective film layer ENC, a black matrix layer BM, and a color filter layer CF.

First through third subpixels SP1 through SP3 are defined based on the transistor part TFTA, organic light-emitting diodes OLED, and color filter layer CF included in the display panel. The areas of the first through third subpixels SP1 through SP3 are defined by a bank layer 120 that lies on the transistor part TFTA. The areas in which the bank layer 120 is located are defined as non-light-emitting areas where light is not emitted, and the areas in which the first electrode layer 119 is exposed are defined as light-emitting areas or openings where light is emitted.

The transistor part TFTA lies over the first substrate 110a. In each of the first through third subpixels SP1 through SP3, the transistor part TFTA comprises a switching transistor, a driving transistor, a capacitor, and a power supply line. As explained previously in FIG. 3, the transistor part TFTA varies enormously in configuration and has various stack structures depending on the position of a gate electrode like a top-gate electrode or bottom-gate electrode. Thus, the transistor part TFTA is not depicted in detail. The components included in the transistor part TFTA, such as the switching transistor, driving transistor, capacitor, etc., are protected by an insulating layer or protective layer.

The organic light-emitting diodes OLED comprise a first electrode layer 119, an emissive layer 124, and a second electrode layer 125 that lie over the transistor part TFTA. The first electrode layer 119 may be anode, and the second electrode 125 may be cathode. The first electrode layer 119 lies on the protective layer which is the uppermost layer of the transistor part TFTA. The first electrode layer 119 is connected to a source or drain electrode of the driving transistor included in the transistor part TFTA. The first electrode layer 119 is positioned to correspond to the light-emitting areas (light-emitting surfaces) of the first through third subpixels SP1 through SP3. The first electrode layer 119 may consist of a single layer or multiple layers comprising a reflective electrode layer.

The emissive layer 124 lies over the first electrode layer 119. The emissive layer 124 may include one emissive layer or at least two emissive layers. The second electrode layer 125 lies over the emissive layer 124. The second electrode layer 125 is positioned to cover the first through third subpixels SP altogether. The second electrode layer 125 may consist of a single layer or multiple layers comprising a low-resistivity layer. The protective film layer ENC lies over the organic light-emitting diodes OLED. The protective film layer ENC may consist of a single layer or multiple layers. The protective film layer ENC may comprise first through third protective film layers 127 through 129, which may have a stack structure of an inorganic material (e.g., SiNx) and an organic material (e.g., monomer) alternating with each other. For example, the first protective layer 127 may be made of an inorganic material (e.g., SiNx), the second protective film layer 128 may be made of an organic material (e.g., monomer), and the third protective film layer 129 may be made of an inorganic material (e.g., SiNx), but not limited to these materials.

The black matrix layer BM may lie on the protective film layer ENC. The black matrix layer BM is positioned to correspond to the bank layer 120. The black matrix layer BM may comprise a black material that can block the light emitted from the organic light-emitting diodes OLED. Although the black matrix layer BM is illustrated as lying on the protective film layer ENC, it may be omitted or located on other layers, like on top of the color filter layer CF.

The color filter layer CF may lie on the protective film layer ENC. The color filter layer CF may comprise first through third color filter layers CF1 through CF3, and may comprise materials of various colors that can turn the light produced by the organic light-emitting diodes OLED to red, green, and blue. Although the color filter layer CF is illustrated as covering the black matrix layer BM on the protective film layer ENC, it may be omitted or located on other layers.

The bank layer 120 has bank grooves BH formed by recessing the top surface. Although the bank grooves BH are illustrated as comprising a bottom surface and an inner surface and having a rectangular cross-sectional shape, it may be, but not limited to, triangular, trapezoidal, or polygonal. Due to the bank grooves BH, the bank layer 120 has an outer surface and an inner surface. Thus, the inner surface of the bank grooves BH may be defined as the inner surface of the bank layer 120. The bank grooves BH formed in the top surface of the bank layer 120 serve to separate the emissive layer 124 for each subpixel region (to separate each subpixel from adjacent subpixels).

Specifically, the bank grooves BH separate the emissive layer 124 to provide a space for solving the problem of leakage current (or often referred to as lateral current leakage) between vertically or laterally adjacent pixels. The problem of leakage current is highly likely to occur especially in a structure where the charge generation layer is formed. Therefore, the bank grooves BH may provide greater benefits when the charge generation layer is included. Meanwhile, the emissive layer 124 and the second electrode layer 125 may be separated together depending on the shape of the bank grooves BH and the structure (especially, thickness) of the second electrode layer 125, but not limited to this.

The low-reflectivity layer 130 lies over the bank grooves BH of the bank layer 120. The low-reflectivity layer 130 may be recessed along the bank grooves BH. The low-reflectivity layer 130 may be positioned to correspond to the top surface of the bank layer 120, as well as the bottom surface and inner surface of the bank grooves BH. The low-reflectivity layer 130 may have a U-shape as shown in the drawing, or may have a shape similar to the bank layer 120 and bank grooves BH, including triangular, rectangular, trapezoidal, and polygonal. The low-reflectivity layer 130 may be formed in various shapes, as long as it does not block the path of light traveling through the light-emitting areas (light-emitting surfaces) of the first through third subpixels SP1 through SP3. The low-reflectivity layer 130 may be formed of a single layer and made of a low-reflectivity material—for example, Mo, Ti, Zr, Hf, V, Nb, Ta, Cr, and W and one or more alloys containing them.

The low-reflectivity layer 130 serves to solve the problem of a light path formed by the bank grooves BH in the bank layer 120, along which light is moved to adjacent subpixels or reflected, and the problem of color mixing in which different kinds of light (colors) are mixed due to the light transmitted through the light path. The low-reflectivity layer 130 may lie on the second electrode layer 125 on the bank grooves BH. The low-reflectivity layer 130 lying on the second electrode layer 125 on the bank grooves BH may solve the problem of light path formation and the problem of color mixing and, at the same time, reduce the resistance of the second electrode layer 125. However, whether the resistance of the second electrode layer 125 is reduced or not depends on the material of the low-reflectivity layer 130.

The low-reflectivity layer 130 may be positioned between the layers of the protective film layer ENC on the bank grooves BH. For example, the low-reflectivity layer 130 may lie directly on the first protective film layer 127 on the bank grooves BH. The low-reflectivity layer 130 lying directly on the first protective film layer 127 on the bank grooves BH may solve the problem of light path formation and the problem of color mixing more effectively due to the material property of the protective film layer ENC (the difference in refractive index between the layers constituting the protective film layer).

This is because it is possible to prevent a waveguide phenomenon in which a light path is formed due to the difference in refractive index between the layers constituting the protective film layer ENC. Thus, the closer the low-reflectivity layer 130 is to where there is a difference in refractive index, like directly over the first protective film layer 127, the better. However, the low-reflectivity layer 130 may be located on other layers depending on the material of the protective film layer ENC and the difference in the refractive index thereof.

As shown in (a) of FIG. 8, if only the bank grooves BH exist in the bank layer 120, a light path is formed along which the light produced from the first subpixel SP1 is moved to the second subpixel SP2 adjacent to the first subpixel SP1. On the other hand, as shown in (b) of FIG. 8, if the low-reflectivity layer 130 exists in the bank grooves BH of the bank layer 120, no light path is formed along which the light produced from the first subpixel SP1 is moved to the second subpixel SP2 adjacent to the first subpixel SP1. This is because, as explained previously, it is possible to prevent a waveguide phenomenon in which the low-reflectivity layer 130 in the bank grooves BH causes light path formation.

As can be seen from the example given in FIGS. 8A and 8B, according to the first exemplary aspect, the light coming through the bank layer 120 and the bank grooves BH may be absorbed by the low-reflectivity layer 130. Moreover, the light produced by the first subpixel SP1 is not moved to the second subpixel SP2 but lost due to the low reflectivity of the low-reflectivity layer 130.

The subpixels become smaller in size on a display panel with an ultra-high resolution; therefore, it is highly likely that current leakage to adjacent subpixels might occur. However, with the structure given in the first exemplary aspect, it is possible to solve the problem of a light path along which light is moved to adjacent subpixels or reflected and the problem of color mixing in which different kinds of light (colors) are mixed, as well as the problem of leakage current through the emissive layer 124. Therefore, the first exemplary aspect may provide a structure suitable for making an organic light-emitting display device with an ultra-high resolution.

The second exemplary aspect of the present disclosure to be described below is similar to the first exemplary aspect, but there is a difference in the structure of the low-reflectivity layer 130. Thus, to avoid redundancy, the description will be given with respect to changes made to the structure of the low-reflectivity layer 130.

<Second Exemplary Aspect>

Figure 9:
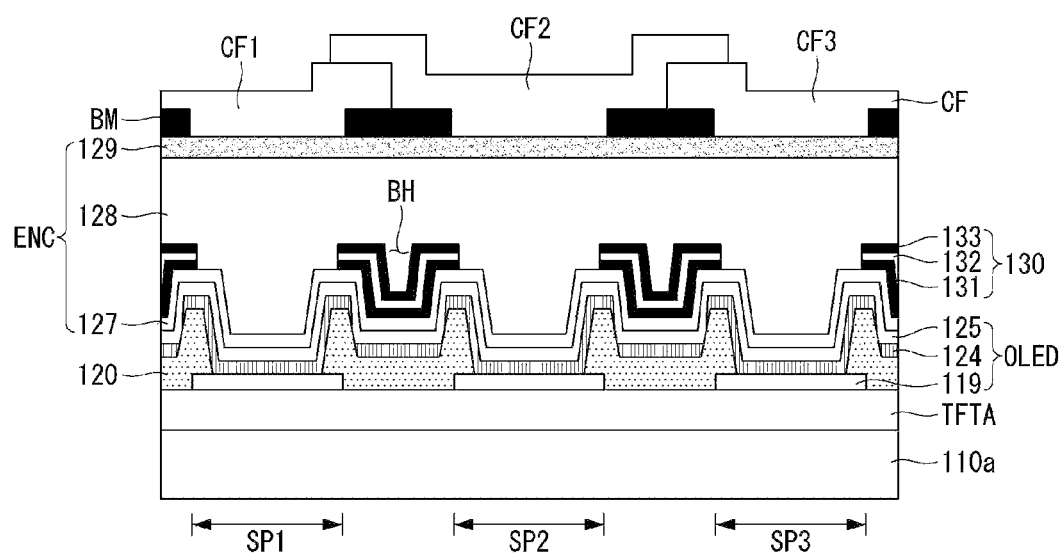
FIG. 9 is a cross-sectional view of a display panel according to a second exemplary aspect of the present disclosure.
Figure 10A:
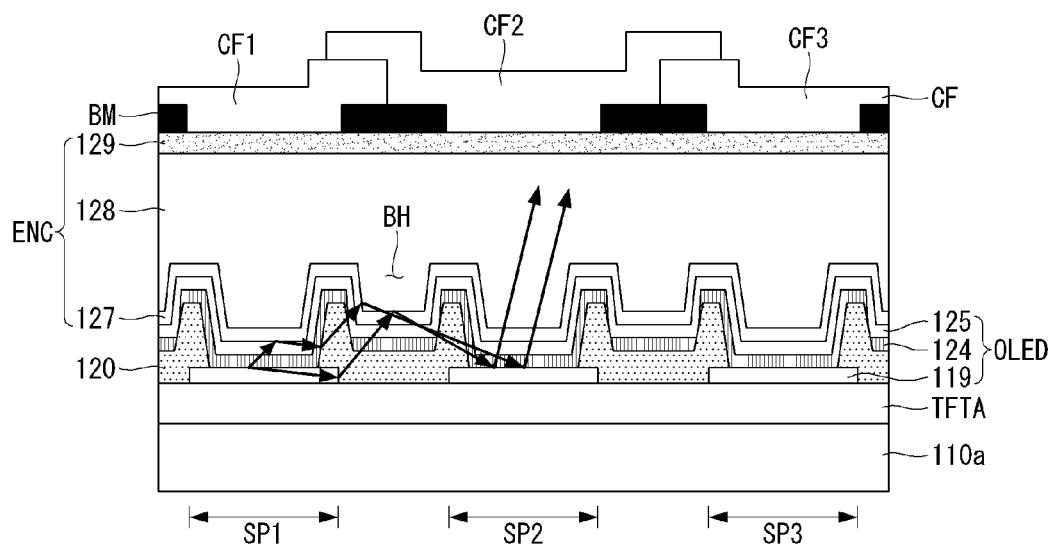
FIGS. 10A and 10B are cross-sectional views for explaining benefits of the second exemplary aspect of the present disclosure.
Figure 10B:
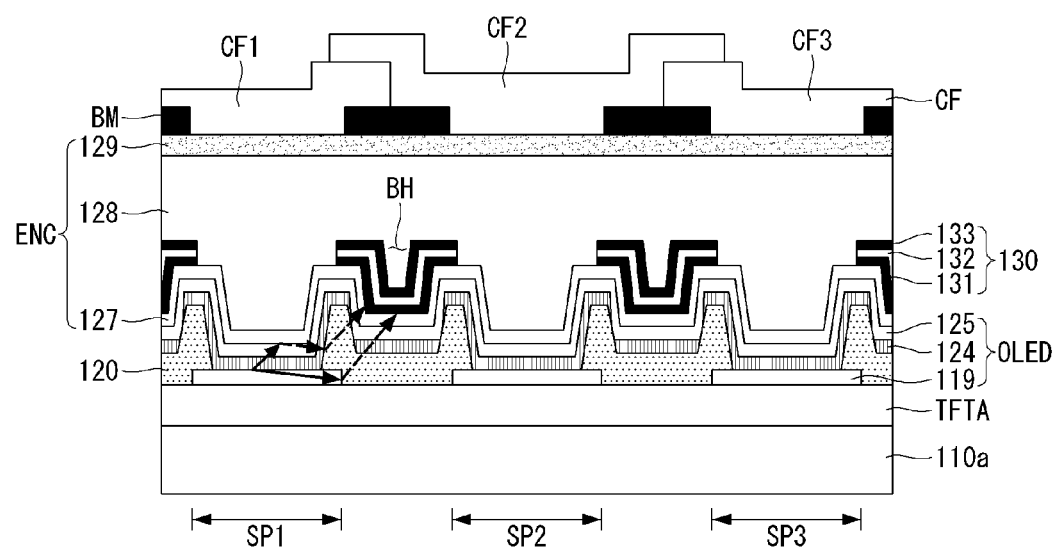
Figure 11:
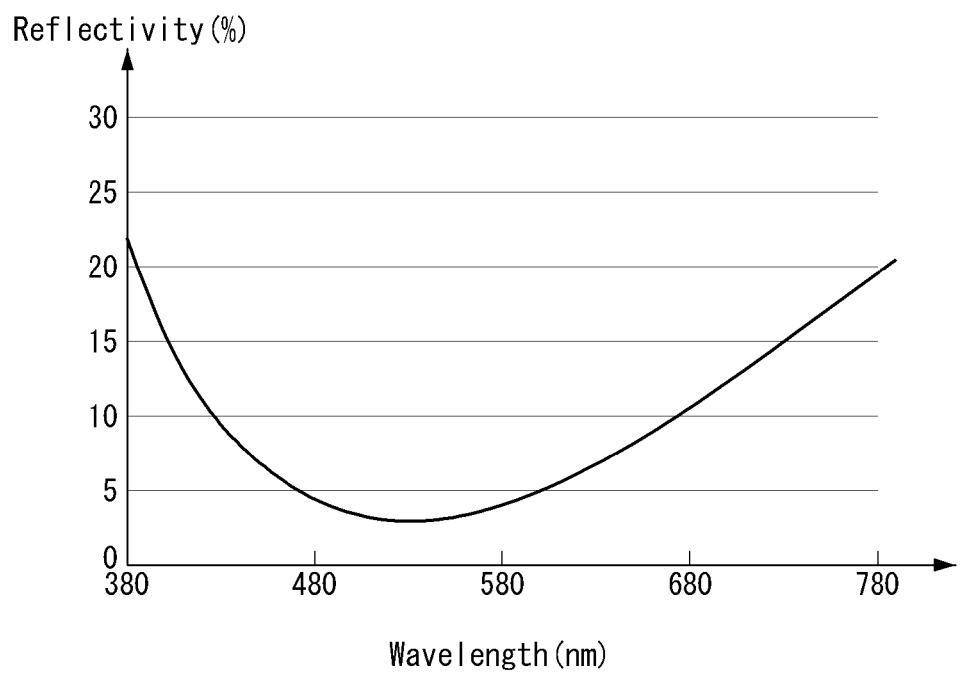
FIG. 11 shows simulation results for the refractivity vs wavelength of the display panel manufactured according to the second exemplary aspect of the present disclosure.

FIG. 9 is a cross-sectional view of a display panel according to a second exemplary aspect of the present disclosure. FIGS. 10A and 10B are cross-sectional views for explaining benefits of the second exemplary aspect of the present disclosure. FIG. 11 shows simulation results for the refractivity vs wavelength of the display panel manufactured according to the second exemplary aspect of the present disclosure.

As shown in FIG. 9, the display panel according to the second exemplary aspect of the present disclosure comprises a first substrate 110a, a transistor part TFTA, organic light-emitting diodes OLED, a low-reflectivity layer 130, a protective film layer ENC, a black matrix layer BM, and a color filter layer CF.

Although the low-reflectivity layer 130 is illustrated as lying directly on the first protective film layer 127 on the bank grooves BH, this is merely an example and, as explained previously, the low-refractivity layer 130 may lie on the second electrode layer 125 or be located inside the protective film layer ENC.

According to the second exemplary aspect, the low-reflectivity layer 130 may be formed of multiple layers and composed of a metal layer made of a low-reflectivity material—for example, Mo, Ti, Zr, Hf, V, Nb, Ta, Cr, and W and one or more alloys containing them—and an inorganic layer made of an inorganic material (comprising an oxide material). For example, the low-reflectivity layer 130 may comprise a first layer 131 made of a metal material, a second layer 132 made of an inorganic material, and a third layer 133 made of a metal material.

As can be seen from the example given in FIG. 10, the light coming through the outer surface of the bank layer 120 may be absorbed by the low-reflectivity layer 130, or may not be moved from the first subpixel SP1 to the second subpixel SP2 but lost due to the low reflectivity of the low-reflectivity layer 130.

As shown in FIGS. 9, 10A, 10B and 11, the low-reflectivity layer 130 has a first layer 131 of MoTi, a second layer 132 of ITO, and a third layer 133 of MoTi. From the simulation results of the second exemplary aspect, the low-reflectivity layer 130 of MoTi/ITO/MoTi showed an average reflectivity (%) of 8.97 at wavelengths of 380 nm to 780 nm, and showed a reflectivity (%) of 3.04 at a wavelength of 550 nm. Therefore, the low-reflectivity layer 130 consisting of multiple layers may be optimized to have the highest reflectivity versus wavelength by using the cancellation and interference of light.

<Third Exemplary Aspect>

Figure 12:
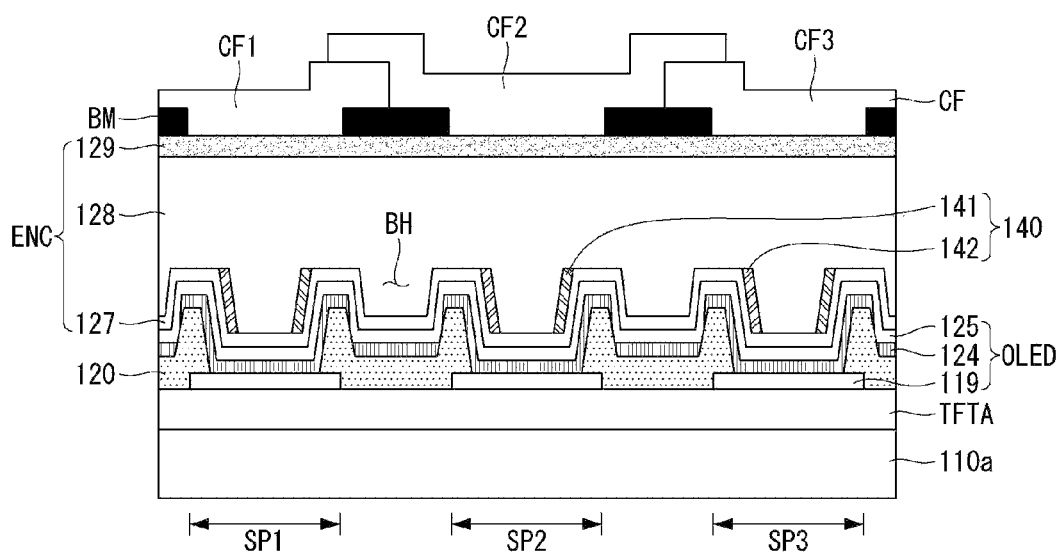
FIG. 12 is a cross-sectional view of a display panel according to a third exemplary aspect of the present disclosure.
Figure 13:
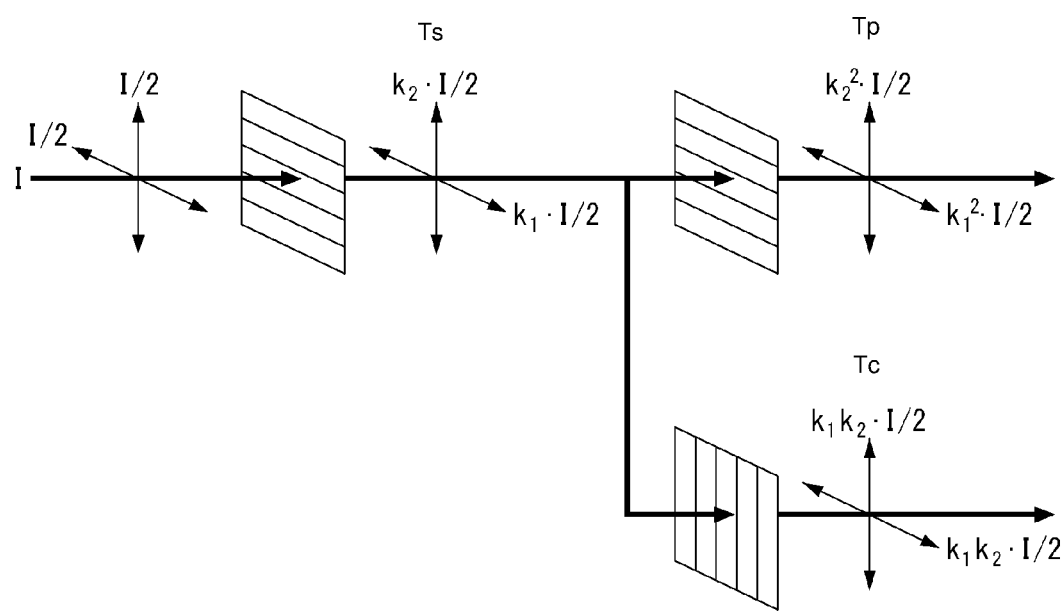
FIG. 13 is a cross-sectional view for schematically explaining a mechanism according to the third exemplary aspect of the present disclosure.

FIG. 12 is a cross-sectional view of a display panel according to a third exemplary aspect of the present disclosure. FIG. 13 is a cross-sectional view for schematically explaining a mechanism according to the third exemplary aspect of the present disclosure.

As shown in FIG. 12, the display panel according to the third exemplary aspect of the present disclosure comprises a first substrate 110a, a transistor part TFTA, organic light-emitting diodes OLED, a polarization layer 140, a protective film layer ENC, a black matrix layer BM, and a color filter layer CF.

First through third subpixels SP1 through SP3 are defined based on the transistor part TFTA, organic light-emitting diodes OLED, and color filter layer CF included in the display panel. The areas of the first through third subpixels SP1 through SP3 are defined by a bank layer 120 that lies on the transistor part TFTA. The areas in which the bank layer 120 is located are defined as non-light-emitting areas where light is not emitted, and the areas in which the first electrode layer 119 is exposed are defined as light-emitting areas or openings where light is emitted.

The transistor part TFTA lies over the first substrate 110a. In each of the first through third subpixels SP1 through SP3, the transistor part TFTA comprises a switching transistor, a driving transistor, a capacitor, and a power supply line. As explained previously in FIG. 3, the transistor part TFTA varies enormously in configuration and has various stack structures depending on the position of a gate electrode like a top-gate electrode or bottom-gate electrode. Thus, the transistor part TFTA is not depicted but omitted.

The organic light-emitting diodes OLED comprise a first electrode layer 119, an emissive layer 124, and a second electrode layer 125 that lie over the transistor part TFTA. The first electrode layer 119 may be anode, and the second electrode 125 may be cathode. The first electrode layer 119 lies on the protective layer which is the uppermost layer of the transistor part TFTA. The first electrode layer 119 is connected to a source or drain electrode of the driving transistor included in the transistor part TFTA. The first electrode layer 119 is positioned to correspond to the light-emitting areas (light-emitting surfaces) of the first through third subpixels SP1 through SP3. The first electrode layer 119 may consist of a single layer or multiple layers comprising a reflective electrode layer.

The emissive layer 124 lies over the first electrode layer 119. The emissive layer 124 may include one emissive layer or at least two emissive layers. The second electrode layer 125 lies over the emissive layer 124. The second electrode layer 125 is positioned to cover the first through third subpixels SP altogether. The second electrode layer 125 may consist of a single layer or multiple layers comprising a low-resistivity layer. The protective film layer ENC lies over the organic light-emitting diodes OLED. The protective film layer ENC may consist of a single layer or multiple layers. The protective film layer ENC may comprise first through third protective film layers 127 through 129, which may have a stack structure of an inorganic material (e.g., SiNx) and an organic material (e.g., monomer) alternating with each other. For example, the first protective layer 127 may be made of an inorganic material (e.g., SiNx), the second protective film layer 128 may be made of an organic material (e.g., monomer), and the third protective film layer 129 may be made of an inorganic material (e.g., SiNx), but not limited to these materials.

The black matrix layer BM may lie on the protective film layer ENC. The black matrix layer BM is positioned to correspond to the bank layer 120. The black matrix layer BM may comprise a black material that can block the light emitted from the organic light-emitting diodes OLED. Although the black matrix layer BM is illustrated as lying on the protective film layer ENC, it may be omitted or located on other layers, like on top of the color filter layer CF.

The color filter layer CF may lie on the protective film layer ENC. The color filter layer CF may comprise first through third color filter layers CF1 through CF3, and may comprise materials of various colors that can turn the light produced by the organic light-emitting diodes OLED to red, green, and blue. Although the color filter layer CF is illustrated as covering the black matrix layer BM on the protective film layer ENC, it may be omitted or located on other layers.

The bank layer 120 has bank grooves BH formed by recessing the top surface. Although the bank grooves BH are illustrated as comprising a bottom surface and an inner surface and having a rectangular cross-sectional shape, it may be, but not limited to, triangular, trapezoidal, or polygonal. Due to the bank grooves BH, the bank layer 120 has an outer surface and an inner surface. Thus, the inner surface of the bank grooves BH may be defined as the inner surface of the bank layer 120. The bank grooves BH formed in the top surface of the bank layer 120 serve to separate the emissive layer 124 for each subpixel region (to separate each subpixel off from adjacent subpixels).

Specifically, the bank grooves BH separate the emissive layer 124 to provide a space for solving the problem of leakage current between vertically or laterally adjacent pixels. The problem of leakage current is highly likely to occur especially in a structure where the charge generation layer is formed. Therefore, the bank grooves BH may provide greater benefits when the charge generation layer is included. Meanwhile, the emissive layer 124 and the second electrode layer 125 may be separated together depending on the shape of the bank grooves BH and the structure (especially, thickness) of the second electrode layer 125, but not limited to this.

A polarization layer 140 is positioned to correspond to the outer surface of the bank layer 120. The polarization layer 140 may be formed along the outer surface of the bank layer 120. The polarization layer 140 may be positioned to correspond to the top surface of the bank layer 120, as well as the outer surface of the bank layer 120. The polarization layer 140 may be formed in various shapes, as long as it does not block the path of light traveling through the light-emitting areas (light-emitting surfaces) of the first through third subpixels SP1 through SP3.

The polarization layer 140 serves to solve the problem of a light path formed by the bank grooves BH in the bank layer 120, along which light is moved to adjacent subpixels or reflected, and the problem of color mixing in which different kinds of light (colors) are mixed due to the light transmitted through the light path. The polarization layer 140 is made of an inorganic polarizing material (e.g., MoS2) that can change the direction of light travel. The polarization layer 140 may be made of any material that can adjust the direction of polarization by rubbing or ion beam treatment.

The polarization layer 140 comprises a first polarization layer 141 and a second polarization layer 142. The first polarization layer 141 and the second polarization layer 142 have different polarization properties. That is, the first polarization layer 141 and the second polarization layer 142 have different polarization directions. When viewed from the side of the bank layer 120, the first polarization layer 141 and the second polarization layer 142 are positioned to correspond to the outer surface (the left and right surfaces of the bank layer), whereas, when viewed from the side of the subpixels, the first polarization layer 141 and the second polarization layer 142 are positioned within the openings.

For example, the first polarization layer 141 is positioned to correspond to the outer surface of the bank layer 120 adjacent to the right (or top depending on the orientation of the first substrate) of the third subpixel SP3. Also, the second polarization layer 142 is positioned to correspond to the outer surface of the bank layer 120 adjacent to the left (or bottom depending on the orientation of the first substrate) of the third subpixel SP3. Therefore, it can be said that the first polarization layer 141 and second polarization layer 142 having different polarization properties are positioned at opposite sides within the opening of each subpixel, along the outer surface of the bank layer 120.

As shown in FIG. 13, the polarization layer lowers the intensity of transmitted light, has a polarization property that changes the direction of light travel, and allows light to pass through if the polarization direction of the polarization layer and the polarization direction of light are the same but does not allow light to pass if the polarization direction of the polarization layer and the polarization direction of light are not the same.

Unit transmission coefficient(Transmissivity of light passing through one sheet of polarization layer): $T_s=(k_1+k_1)/2$ Parallel transmission coefficient(Transmissivity of light passing through two sheets of polarization layer whose transmission axes are parallel to each other): $T_p=(k_1^2+k_2^2)/2$ Orthogonal transmission coefficient (Transmissivity of light passing through two sheets of polarization layer whose transmission axes are orthogonal to each other): $T_c=k_1 k_2$ Degree of polarization: $P=((T_p-T_c)/(T_p+T_c))$ Contrast Ratio: $CR=T_p/T_c$ The third exemplary aspect depicted in FIG. 12 is based on the polarization property of the polarization layer 140. Thus, the polarization directions of the first polarization layer 141 and second polarization layer 142 may be selected based on the polarization property of light produced from the emissive layer 124. For example, when light is emitted vertically (toward the front of the second substrate) from the emissive layer 124, the first polarization layer 141 may have a horizontal or vertical linear polarization property, and the second polarization layer 142 may have a vertical or horizontal linear polarization property, which is the opposite of the first polarization layer 141.

In the third exemplary aspect, if the polarization layer 140 exists, corresponding to the outer surface of the bank layer 120, no light path is formed along which the light produced from the first subpixel SP1 is moved to the second subpixel SP2 adjacent to the first subpixel SP1. This is because, as explained previously, the first polarization layer 141 and the second polarization layer 142 have different polarization directions and, therefore, even if light passes through the bank layer 120 and the bank grooves BH at one side, it cannot travel to the other side. That is, light is not moved to neighboring subpixels but lost since the first polarization layer 141 and the second polarization layer 142 have different polarization directions. Thus, the third exemplary aspect may solve the problem of a light path along which light is moved to adjacent subpixels or reflected and the problem of color mixing in which different kinds of light (colors) are mixed, allowing for a structure suitable for making an organic light-emitting display device with an ultra-high resolution.

Like the low-reflectivity layer of the first exemplary aspect, the polarization layer 140 of the third exemplary aspect prevents the formation of a light path caused by the difference in refractive index between the layers constituting the protective film layer ENC. Thus, the closer the polarization layer 140 is to where there is a difference in refractive index, like directly over the first protective film layer 127, the better. However, the polarization layer 140 may be located on other layers depending on the material of the protective film layer ENC and the difference in the refractive index thereof.

As discussed above, with the structure given in the third exemplary aspect, it is possible to solve the problem of a light path along which light is moved to adjacent subpixels or reflected and the problem of color mixing in which different kinds of light (colors) are mixed, as well as the problem of leakage current through the emissive layer 124. Therefore, the third exemplary aspect may provide a structure suitable for making an organic light-emitting display device with an ultra-high resolution.

The exemplary aspects of the present disclosure to be described below are similar to the third exemplary aspect, but there is a difference in the structure of the polarization layer 140. Thus, to avoid redundancy, the description will be given with respect to changes made to the structure of the polarization layer 140.

<Fourth Exemplary Aspect>

Figure 14:
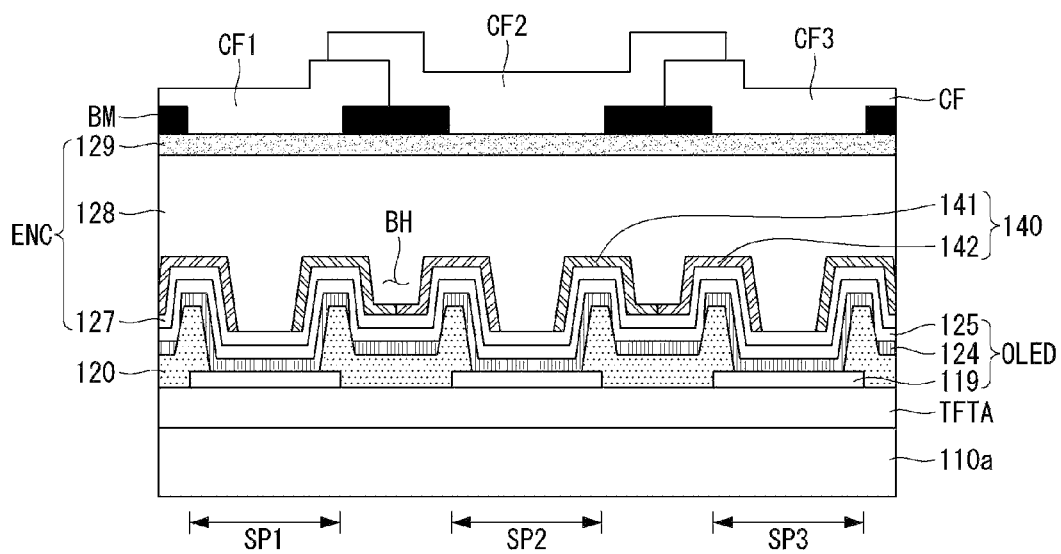
FIG. 14 is a cross-sectional view of a display panel according to a fourth exemplary aspect of the present disclosure.

FIG. 14 is a cross-sectional view of a display panel according to a fourth exemplary aspect of the present disclosure.

As shown in FIG. 14, the display panel according to the fourth exemplary aspect of the present disclosure comprises a first substrate 110a, a transistor part TFTA, organic light-emitting diodes OLED, a polarization layer 140, a protective film layer ENC, a black matrix layer BM, and a color filter layer CF.

According to the fourth exemplary aspect, the polarization layer 140 may be placed close to where there is a difference in refractive index between the layers of the protective film layer ENC, like directly over the first protective film layer 127. The polarization layer 140 is positioned to correspond to the tops of the bank layer 120 and bank grooves BH. The polarization layer 140 may be recessed along the bank grooves BH. The polarization layer 140 may be positioned to correspond to the top surface and outer surface of the bank layer 120, as well as the bottom surface and inner surface of the bank grooves BH. That is, the polarization layer 140 may be formed to cover all areas of the underlying layer, except the light-emitting areas (light-emitting surfaces) of the first through third subpixels SP1 through SP3. In this case, the first polarization layer 141 and the second polarization layer 142 may be in, but not limited to, a 1:1 ratio relative to the center area of the bank grooves BH.

The polarization directions of the first polarization layer 141 and second polarization layer 142 of the polarization layer 140 may be selected based on the polarization property of light produced from the emissive layer 124. For example, when light is emitted vertically (toward the front of the second substrate) from the emissive layer 124, the first polarization layer 141 may have a horizontal or vertical linear polarization property, and the second polarization layer 142 may have a vertical or horizontal linear polarization property, which is the opposite of the first polarization layer 141.

In the fourth exemplary aspect, the polarization layer 140 covers the areas corresponding to the bank layer 120 and bank grooves BH. In this structure, the bank layer 120 and even the bank grooves BH are covered, thereby reducing the likelihood of light path formation and the likelihood of color mixing.

<Fifth Exemplary Aspect>

Figure 15:
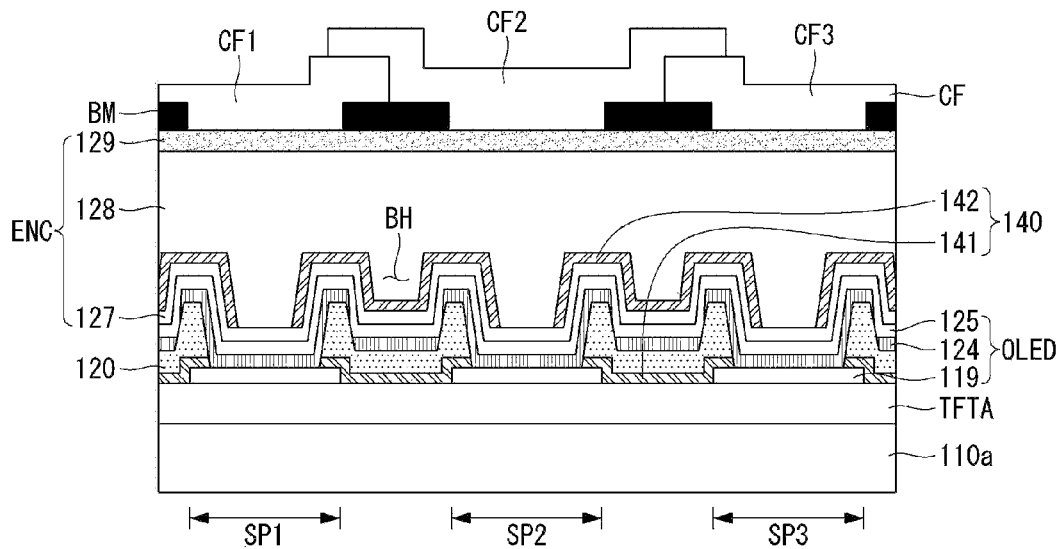
FIG. 15 is a cross-sectional view of a display panel according to a fifth exemplary aspect of the present disclosure.

FIG. 15 is a cross-sectional view of a display panel according to a fifth exemplary aspect of the present disclosure.

As shown in FIG. 15, the display panel according to the fifth exemplary aspect of the present disclosure comprises a first substrate 110a, a transistor part TFTA, organic light-emitting diodes OLED, a polarization layer 140, a protective film layer ENC, a black matrix layer BM, and a color filter layer CF.

According to the fifth exemplary aspect, the polarization layer 140 may be placed close to where there is a difference in refractive index between the layers of the protective film layer ENC, like directly over the first protective film layer 127. The polarization layer 140 comprises a first polarization layer 141 positioned between the transistor part TFTA and the bank layer 120 and a second polarization layer 142 positioned between the bank layer 120 and the top of the bank grooves BH.

The first polarization layer 141 may be located between the transistor part TFTA and the bank layer 120—in other words, directly underneath the bank layer 120. The first polarization layer 141 may lie on the transistor part TFTA and cover part of the first electrode layer 119. The first polarization layer 141 may be positioned to correspond in size to the bank layer 120 so as to cover part of the first electrode layer 119, or may be positioned in the spaces in the first electrode layer 119.

The second polarization layer 142 may be positioned to correspond to the top surface and outer surface of the bank layer 120, as well as the bottom surface and inner surface of the bank grooves BH. The second polarization layer 142 may be recessed along the bank grooves BH. The second polarization layer 142 may be formed to cover all areas of the underlying layer, except the light-emitting areas (light-emitting surfaces) of the first through third subpixels SP1 through SP3, but not limited to this.

The first polarization layer 141 and the second polarization layer 142 have different polarization properties. The polarization properties of the first polarization layer 141 and second polarization layer 142 are selected based on the polarization property of light produced from the emissive layer 124. For example, when light is emitted vertically (toward the front of the second substrate) from the emissive layer 124, the first polarization layer 141 may have a horizontal or vertical linear polarization property, and the second polarization layer 142 may have a vertical or horizontal linear polarization property, which is the opposite of the first polarization layer 141.

In the fifth exemplary aspect, along with the second polarization layer 142 covering the areas corresponding to the bank layer 120 and bank grooves BH, the first polarization layer 141 is located underneath the bank layer 120. In this structure, the top and bottom of the bank layer 120 and even the bank grooves BH are covered, thereby more effectively reducing the likelihood of light path formation and the likelihood of color mixing.

<Sixth Exemplary Aspect>

Figure 16:
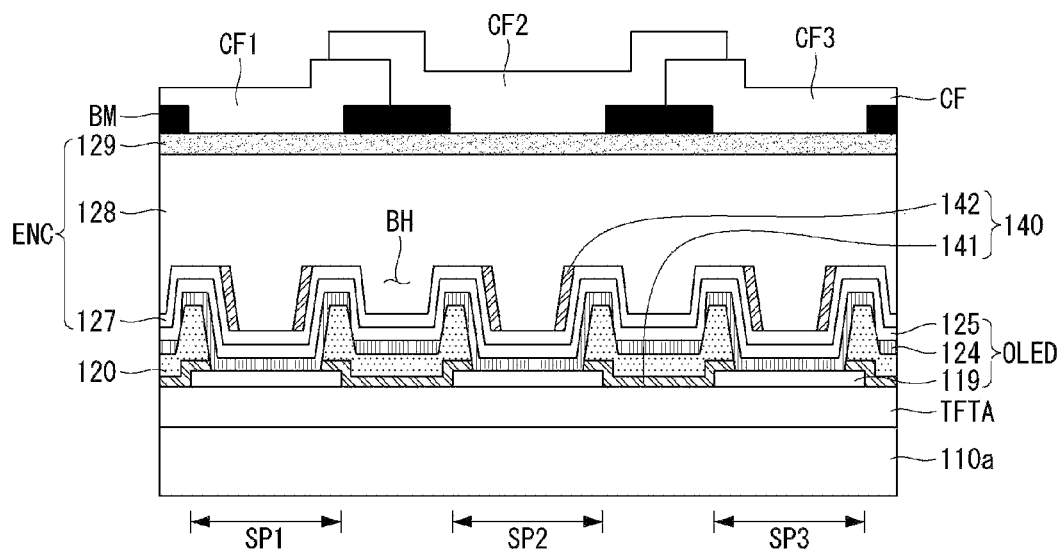
FIG. 16 is a cross-sectional view of a display panel according to a sixth exemplary aspect of the present disclosure.

FIG. 16 is a cross-sectional view of a display panel according to a sixth exemplary aspect of the present disclosure.

As shown in FIG. 16, the display panel according to the sixth exemplary aspect of the present disclosure comprises a first substrate 110a, a transistor part TFTA, organic light-emitting diodes OLED, a polarization layer 140, a protective film layer ENC, a black matrix layer BM, and a color filter layer CF.

According to the sixth exemplary aspect, the polarization layer 140 may be placed close to where there is a difference in refractive index between the layers of the protective film layer ENC, like directly over the first protective film layer 127. The polarization layer 140 comprises a first polarization layer 141 positioned between the transistor part TFTA and the bank layer 120 and a second polarization layer 142 positioned to correspond to the outer surface of the bank layer 120.

The first polarization layer 141 may be located between the transistor part TFTA and the bank layer 120—in other words, underneath the bank layer 120. The first polarization layer 141 may lie on the transistor part TFTA and cover part of the first electrode layer 119. The first polarization layer 141 may be positioned to correspond in size to the bank layer 120 so as to cover part of the first electrode layer 119, or may be positioned in the spaces in the first electrode layer 119.

The second polarization layer 142 may be positioned to correspond to the outer surface of the bank layer 120. The second polarization layer 142 may be partially located on the top surface of the bank layer 120, except the areas corresponding to the bank grooves BH.

The first polarization layer 141 and the second polarization layer 142 have different polarization properties. The polarization properties of the first polarization layer 141 and second polarization layer 142 are selected based on the polarization property of light produced from the emissive layer 124. For example, when light is emitted vertically (toward the front of the second substrate) from the emissive layer 124, the first polarization layer 141 may have a horizontal or vertical linear polarization property, and the second polarization layer 142 may have a vertical or horizontal linear polarization property, which is the opposite of the first polarization layer 141. The positions of the first polarization layer 141 and second polarization layer 142 may be changed, as in FIG. 18.

In the sixth exemplary aspect, along with the second polarization layer 142 covering the areas corresponding to the outer surface of the bank layer 120, the first polarization layer 141 is located underneath the bank layer 120. In this structure, the side and bottom of the bank layer 120 are covered, thereby reducing the likelihood of light path formation and the likelihood of color mixing.

<Seventh Exemplary Aspect>

Figure 17:
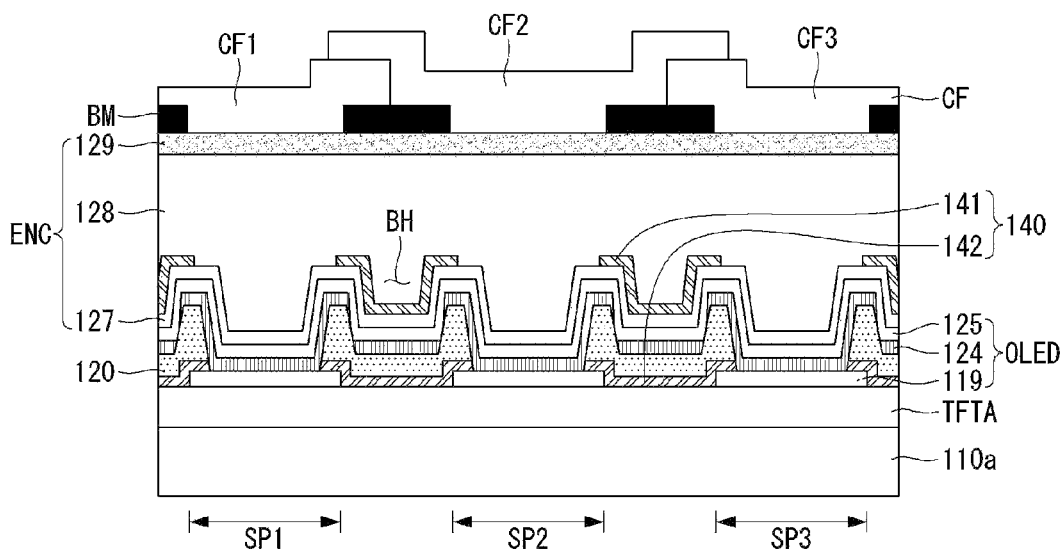
FIG. 17 is a cross-sectional view of a display panel according to a seventh exemplary aspect of the present disclosure.

FIG. 17 is a cross-sectional view of a display panel according to a seventh exemplary aspect of the present disclosure.

As shown in FIG. 17, the display panel according to the seventh exemplary aspect of the present disclosure comprises a first substrate 110a, a transistor part TFTA, organic light-emitting diodes OLED, a polarization layer 140, a protective film layer ENC, a black matrix layer BM, and a color filter layer CF.

According to the seventh exemplary aspect, the polarization layer 140 may be placed close to where there is a difference in refractive index between the layers of the protective film layer ENC, like directly over the first protective film layer 127. The polarization layer 140 comprises a first polarization layer 141 positioned to correspond to the bank grooves BH and a second polarization layer 142 positioned between the transistor part TFTA and the bank layer 120.

The first polarization layer 141 may be positioned to correspond to the bank grooves BH. The first polarization layer 141 may correspond to the bank grooves BH or be partially located on the top surface of the bank layer 120. That is, the first polarization layer 141 is formed in a U-shape, for example, along the shape of the bank grooves BH.

The second polarization layer 142 may be located between the transistor part TFTA and the bank layer 120—in other words, underneath the bank layer 120. The second polarization layer 142 may lie on the transistor part TFTA and cover part of the first electrode layer 119. The second polarization layer 142 may be positioned to correspond in size to the bank layer 120 so as to cover part of the first electrode layer 119, or may be positioned in the spaces in the first electrode layer 119.

The first polarization layer 141 and the second polarization layer 142 have different polarization properties. The polarization properties of the first polarization layer 141 and second polarization layer 142 are selected based on the polarization property of light produced from the emissive layer 124. For example, when light is emitted vertically (toward the front of the second substrate) from the emissive layer 124, the first polarization layer 141 may have a horizontal or vertical linear polarization property, and the second polarization layer 142 may have a vertical or horizontal linear polarization property, which is the opposite of the first polarization layer 141.

In the seventh exemplary aspect, along with the first polarization layer 141 covering the areas corresponding to the bank grooves BH, the second polarization layer 142 is located underneath the bank layer 120. In this structure, the polarization layer 140 is located in the areas corresponding to the bank grooves BH and underneath the bank layer 120, thereby further reducing the likelihood of light path formation and the likelihood of color mixing.

<Eighth Exemplary Aspect>

Figure 18:
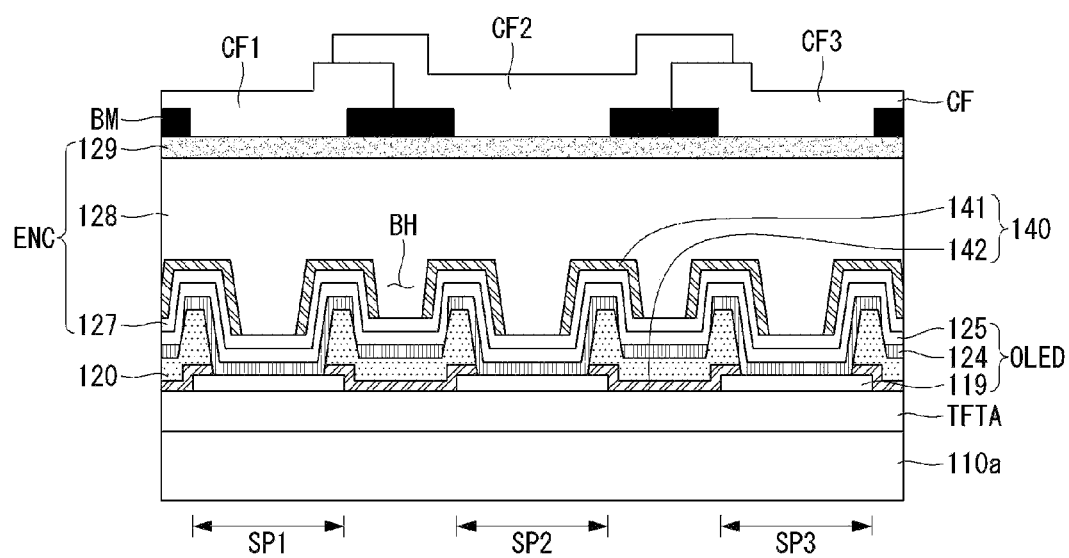
FIG. 18 is a cross-sectional view of a display panel according to an eighth exemplary aspect of the present disclosure.

FIG. 18 is a cross-sectional view of a display panel according to an eighth exemplary aspect of the present disclosure.

As shown in FIG. 18, the display panel according to the eighth exemplary aspect of the present disclosure comprises a first substrate 110a, a transistor part TFTA, organic light-emitting diodes OLED, a polarization layer 140, a protective film layer ENC, a black matrix layer BM, and a color filter layer CF.

According to the eighth exemplary aspect, the polarization layer 140 may be placed close to where there is a difference in refractive index between the layers of the protective film layer ENC, like directly over the first protective film layer 127. The polarization layer 140 comprises a first polarization layer 141 positioned to correspond to the bank grooves BH and a second polarization layer 142 positioned between the transistor part TFTA and the bank layer 120.

The first polarization layer 141 may be positioned to correspond to opposite sides of the inner surface of the bank grooves BH. The first polarization layer 141 may be located not only in the light-emitting areas (light-emitting surfaces) of the subpixels SP1 through SP3 and the areas corresponding to the bottom surface of the bank grooves BH, but also may fully cover the underlying layer. That is, the first polarization layer 141 may be formed in a 180-degree-rotated U-shape along the protruding shape of the bank layer 120, except the bottom surface of the bank grooves BH.

The second polarization layer 142 may be located between the transistor part TFTA and the bank layer 120—in other words, underneath the bank layer 120. The second polarization layer 142 may lie on the transistor part TFTA and cover part of the first electrode layer 119. The second polarization layer 142 may be positioned to correspond in size to the bank layer 120 so as to cover part of the first electrode layer 119, or may be positioned in the spaces in the first electrode layer 119.

The first polarization layer 141 and the second polarization layer 142 have different polarization properties. The polarization properties of the first polarization layer 141 and second polarization layer 142 are selected based on the polarization property of light produced from the emissive layer 124. For example, when light is emitted vertically (toward the front of the second substrate) from the emissive layer 124, the first polarization layer 141 may have a horizontal or vertical linear polarization property, and the second polarization layer 142 may have a vertical or horizontal linear polarization property, which is the opposite of the first polarization layer 141.

In the eighth exemplary aspect, along with the first polarization layer 141 covering the areas corresponding to the inner surface of the bank grooves BH and the top surface and outer surface of the bank layer 120, the second polarization layer 142 is located underneath the bank layer 120. In this structure, the polarization layer is located in the areas corresponding to the inner surface of the bank grooves BH and the top surface and outer surface of the bank layer 120 and underneath the bank layer 120, thereby further reducing the likelihood of light path formation and the likelihood of color mixing.

In the third to eighth exemplary aspects, the polarization layer 140 is illustrated as consisting of a single layer (a single unit composed of one sheet of polarization layer). However, the polarization layer 140 is capable of polarizing light even if it is made nano-thin compared to metal materials. Thus, the polarization layer 140 may consist of multiple layers (including a layer for parallel transmission and a layer for orthogonal transmission) as well. That is, the polarization layer 140 may be configured in such a way that the first polarization layer 141 and the second polarization layer 140 overlap in at least one area. Moreover, the overlapping area between the first polarization layer 141 and the second polarization layer 142 may be adjusted taking the light path into consideration. Besides, in the detailed explanation of the present disclosure, the first through eighth exemplary aspects have been described individually, whereas at least two of these exemplary aspects may be described in combination.

To prevent light path formation and color mixing formation, the low-reflectivity layer and polarization layer explained in the present disclosure are configured in such a way that a low-reflectivity material and a light-polarizing material correspond to the bank layer. The low-reflectivity layer and the polarization layer have the same purposes and benefits, although their names and functions are somewhat different. Accordingly, the low-reflectivity layer and the polarization layer also can be defined as layers that prevent light path formation and color mixing.

As discussed above, the present disclosure may solve the problem of leakage current through the emissive layer, the problem of a light path along which light is moved to adjacent subpixels or reflected, and the problem of color mixing in which different kinds of light (colors) are mixed, in order to make an organic light-emitting display device with an ultra-high resolution.

What is claimed is:
1. A light-emitting display device comprising:
a first substrate;
a first electrode layer on the first substrate;
a bank layer having an opening exposing part of the first electrode layer;
an emissive layer disposed on the first electrode layer;
a bank groove formed by recessing the bank layer;
a second electrode layer disposed on the emissive layer; and a polarization layer disposed on the second electrode layer and is positioned to correspond to at least part of the bank layer, wherein the emissive layer has a first portion disposed inside the bank groove and a second portion disposed outside the bank groove and the first and second portions are disconnected from each other, wherein the polarization layer includes first and second polarization layers that have different polarization properties from each other, wherein the first polarization layer and the second polarization layer are located in different positions, and wherein at least one of the first polarization layer and the second polarization layer is directly located on a same layer as the first electrode layer is located, and another one of the first polarization layer and the second polarization layer is indirectly located on the second electrode layer.

2. The light-emitting display device of claim 1, wherein at least one of the first and second polarization layer covers the underlying layer except for a light-emitting surface of the emissive layer.

3. The light-emitting display device of claim 1, further comprising a protective film layer disposed on the second electrode layer and is formed by alternately stacking an inorganic material and an organic material.

4. The light-emitting display device of claim 3, wherein the protective layer includes more than one layers of the protective layer and the polarization layer is positioned between the more than one layers of the protective film layer.

5. The light-emitting display device of claim 4, wherein the protective film layer includes a first protective film layer, a second protective film layer on the first protective film layer, and a third protective film layer on the second protective film layer, wherein the first and third protective film layers are formed of an inorganic material, and the second protective film layer is formed of an organic material, and the polarization layer is disposed on the first protective film layer.

6. The light-emitting display device of claim 1, wherein at least one of the first and second polarization layer, along with the bank layer, covers the first electrode layer and exposes part of the first electrode layer.

7. The light-emitting display device of claim 1, wherein at least one of the first polarization layer and the second polarization layer are selectively positioned on an outer surface of the bank layer, a top surface of the bank layer, an underneath of the bank layer, an inner surface of the bank groove, or a bottom surface of the bank groove.

8. The light-emitting display device of claim 3, further comprising a black matrix layer and a color filter layer disposed on the protective film layer.

* * * * *